United States Patent
Wang et al.

(10) Patent No.: US 7,678,694 B2
(45) Date of Patent: Mar. 16, 2010

(54) METHOD FOR FABRICATING SEMICONDUCTOR DEVICE WITH SILICIDED GATE

(75) Inventors: Mei-Yun Wang, Hsin-Chu (TW); Cheng-Chen Calvin Hsueh, Taipei County (TW)

(73) Assignee: Taiwan Semicondutor Manufacturing Company, Ltd., Hsin-Chu (TW)

( * ) Notice: Subject to any disclaimer, the term of this patent is extended or adjusted under 35 U.S.C. 154(b) by 148 days.

(21) Appl. No.: 11/787,842

(22) Filed: Apr. 18, 2007

(65) Prior Publication Data

US 2008/0261394 A1  Oct. 23, 2008

(51) Int. Cl.
   *H01L 21/44*  (2006.01)
(52) U.S. Cl. .............. 438/664; 438/656; 438/683; 257/E21.593
(58) Field of Classification Search ........... 438/664, 438/655, 656, 682, 683
   See application file for complete search history.

(56) References Cited

U.S. PATENT DOCUMENTS

| | | | |
|---|---|---|---|
| 6,030,863 A | 2/2000 | Chang et al. | |
| 6,365,446 B1 * | 4/2002 | Chong et al. | 438/197 |
| 6,475,874 B2 | 11/2002 | Xiang et al. | |
| 6,528,981 B1 | 3/2003 | Tsubaki | |
| 6,905,922 B2 | 6/2005 | Lin et al. | |
| 7,067,379 B2 | 6/2006 | Wen et al. | |
| 7,078,278 B2 | 7/2006 | Pan et al. | |
| 7,141,467 B2 | 11/2006 | Hokazono et al. | |
| 7,151,023 B1 * | 12/2006 | Nayfeh et al. | 438/231 |
| 2004/0201066 A1 * | 10/2004 | Han | 257/382 |
| 2005/0009328 A1 * | 1/2005 | Park et al. | 438/666 |
| 2005/0148114 A1 | 7/2005 | Rhodes | |
| 2006/0043497 A1 | 3/2006 | Kimizuka et al. | |
| 2006/0163661 A1 | 7/2006 | Wang et al. | |
| 2006/0194393 A1 | 8/2006 | Muto | |
| 2008/0029822 A1 | 2/2008 | Tsuchiya et al. | |

OTHER PUBLICATIONS

Jaeger, R.C., "Introduction to Microelectronic Fabrication," Modular Series on Solid State Devices, May 1993, 3 pages, Addison-Wesley Publishing Company, Inc.

* cited by examiner

*Primary Examiner*—Walter L Lindsay, Jr.
*Assistant Examiner*—Reema Patel
(74) *Attorney, Agent, or Firm*—Slater & Matsil, L.L.P.

(57) ABSTRACT

A method for fabricating a semiconductor device having a silicided gate that is directed to forming the silicided structures while maintaining gate-dielectric integrity. Initially, a gate structure has, preferably, a poly gate electrode separated from a substrate by a gate dielectric and a metal layer is then deposited over at least the poly gate electrode. The fabrication environment is placed at an elevated temperature. The gate structure may be one of two gate structures included in a dual gate device such as a CMOS device, in which case the respective gates may be formed at different heights (thicknesses) to insure that the silicide forms to the proper phase. The source and drain regions are preferably silicided as well, but in a separate process performed while the gate electrodes are protected by, for example a cap of photoresist or a hardmask structure.

23 Claims, 8 Drawing Sheets

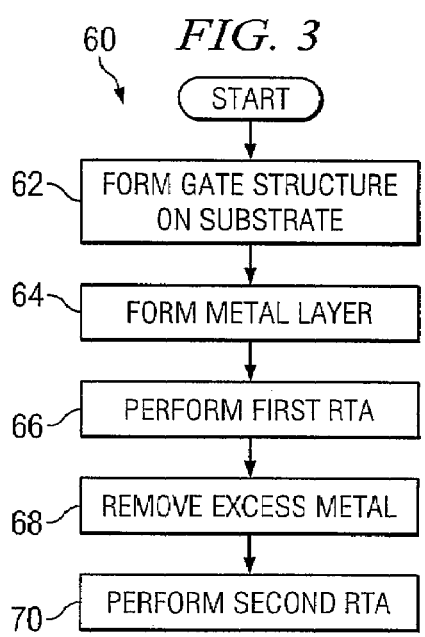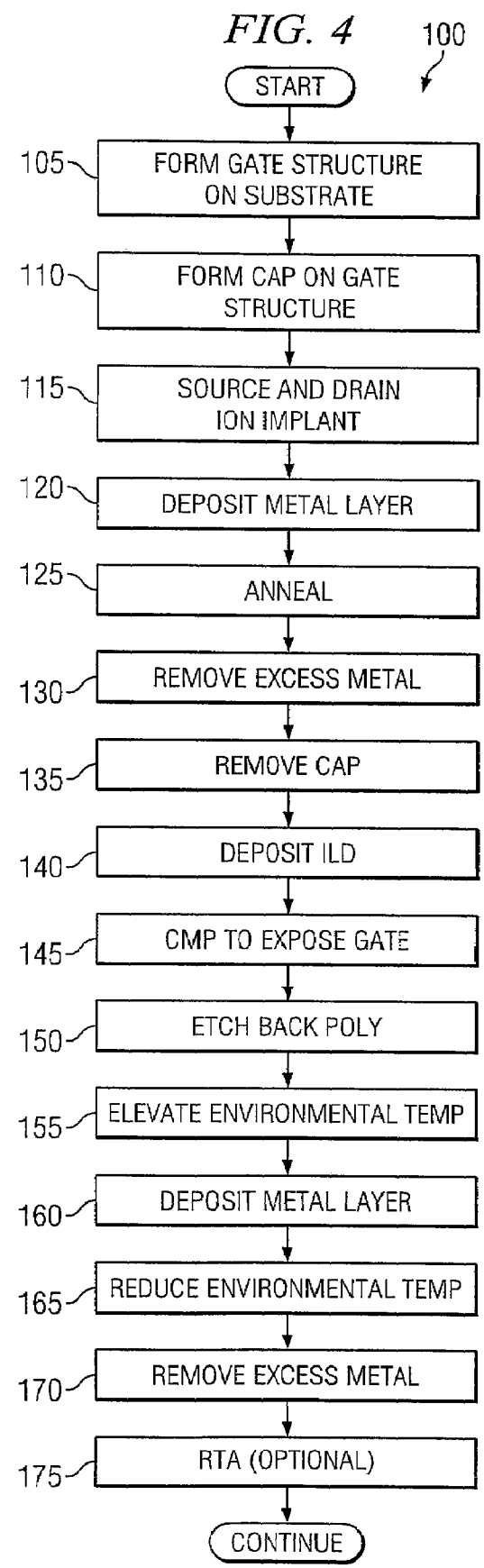

METHOD FOR FABRICATING SEMICONDUCTOR DEVICE WITH SILICIDED GATE

TECHNICAL FIELD

The present invention is generally directed to the field of semiconductor devices and their fabrication, and more specifically directed to a method for fabricating a semiconductor device having a silicided, and preferably a fully-silicided (FUSI) gate while reducing the risk of damaging the gate dielectric material during the silicidation process.

BACKGROUND

Generally, silicidation is a process used in the fabrication of semiconductor devices to alter the composition of certain components with the aim of improving device performance. Semiconductor devices are small electrical components that are fabricated in part out of a semiconductor material such as silicon. Manufacturing electrical components in this manner permits them to be made in a very small size. For example, more than one million transistors may be fabricated on a single thin piece of silicon that is roughly square in shape and less than one inch on each side. The various electrical components fabricated on this single piece of silicon may be connected together by very small conductive elements in order to create integrated circuits. Modem integrated circuits are used in many applications, including the manufacture of computers, mobile telephones, and personal electronic gaming devices.

Most semiconductor devices are too small to be seen with the naked eye. Special fabrication techniques are therefore required for their manufacture. In general, fabrication begins with a thin slice of material, such as silicon, that is used as a substrate on which the various devices can be manufactured. This substrate material is typically formed as a solid ingot, which is then sliced into thin sections called wafers. A single wafer may be used to create over one hundred individual dice, which after fabrication are separated and separately-packaged for use in a particular electrical appliance.

Fabrication techniques may vary, but generally speaking, fabrication involves the sequential formation of layers of different conducting and insulating materials. Portions of each layer may be selectively removed to create small surface structures prior to the formation of the next layer. To accomplish this selective removal, a technique called photolithography may be used. This technique involves the formation of a layer of material referred to as photoresist, which is then selectively exposed to a light energy source that causes the exposed (or, alternately, unexposed) portions of the photoresist layer to change physical properties. A solvent is then used to remove the selected portions, leaving a pattern of structures on the surface that may be used for selective deposition or etching away of the underlying material. The remaining photoresist is removed when it is no longer required, and does not form part of the actual device. Other techniques may be used to similar effect as well.

The electrical appliances mentioned above have become very popular with consumers, in part because of their small size and consequent portability. With their popularity, however, have come demands from the marketplace for even smaller devices that are even more capable. To accomplish this, the tiny semiconductor devices formed in the fabrication process must become even smaller and more tightly packed together. This effort results not only in greater challenges during the fabrication process itself, but gives rise to certain electrical problems, such as current leakage, that detrimentally effect of the performance of the device.

One common semiconductor device is called the transistor. A transistor is a small switch that can control the flow of electricity without the need for any moving parts. One such transistor shown in FIG. 1. FIG. 1 is an elevation (side) view illustrating in cross-section an exemplary transistor 10. Transistor 10 includes a gate structure 11 formed on substrate 12. Gate structure 11 is made up of a number of different component parts. A thin layer of dielectric material, such as an oxide, separates gate electrode 14 from substrate 12. This separating layer may be referred to as gate dialectic 13. Gate electrode 14 is made of a conducting material, for example a metal. More recently, crystalline polysilicon, or simply poly, has been used instead of metal. Disposed above gate electrode 14 in this example is a contact 15, typically made of metal, which may for example be used to make reliable electrical connections between gate electrode 14 and an interconnect coupled to another device (not shown). Spacers 16 and 17, formed of a dielectric material, are disposed on either side of the gate structure 11.

Gate structure 11 is the portion of transistor 10 that controls the flow of electricity. The current itself flows through the substrate between source 18 and drain 19 through channel 20 when a small voltage is applied to the gate structure 11. Source 18 and drain 19 are each formed in the substrate 12 by a local implantation of ions, such as those of boron or phosphorus. This process of ion implantation is sometimes known as doping. Source 18 and drain 19 are in turn connected, for example, to a voltage source and to a ground (not shown), respectively. Metal contacts 21 and 22, disposed on, respectively, source 18 and drain 19, provide a site for terminating such external electrical connections. The process for making a transistor such as transistor 10 will now be briefly explained, with reference to FIG. 2.

FIG. 2 is a flow diagram illustrating an exemplary method 30 of fabricating a semiconductor device, in this case the transistor 10 shown in FIG. 1. At START 17 is assumed that all materials and equipment necessary for performing the method are available and operational. The method begins with forming an oxide layer on a substrate (step 32). A poly layer for the gate electrode is then formed (step 34) as well. A photoresist layer is then formed (step 36) and patterned (step 38) so that a photoresist structure protects the region where the gate structure will be formed. An etching step is then performed (step 40), leaving a gate structure disposed on the substrate. The remaining photoresist may then be removed (step 42). The source region and the drain region may now be partially formed by ion implantation (step 44), which as mentioned above is sometimes called doping. In many cases additional temporary or permanent protective structures must be added and removed as part of the doping process, but these steps are not shown individually. The source and drain regions are said to be partially formed because, in this example, additional ion implantation into these regions will occur later. In an alternate embodiment (not shown), the complete ion implantation is performed at this time.

In this exemplary method, a dielectric layer is then deposited (step 46) and selectively etched (step 48) to form the spacers for the gate structure. An additional ion implantation (step 50) forms the deeper part of the source region and drain region (see FIG. 1) according to the process of this example. An electrical contact region may then be formed on top of the gate electrode at this time (step 52), although the individual steps that may be involved are not separately shown in FIG. 2. At this point a transistor such as the transistor 10 of FIG. 1 has been formed and fabrication may continue with the deposition of additional material layers and the formation of additional devices.

Although, as mentioned above, the gate electrode is often formed of a poly material, it has been found advantageous to enhance the properties of the poly gate by using it to create an alloy with a metal in a process known as silicidation. In this process, generally speaking, a metal layer is deposited on top of an existing poly gate and induced to combine with the poly material in a rapid heating process often referred to as an RTA (rapid thermal anneal). One example of this process, as currently performed, is illustrated in FIG. 3. FIG. 3 is a flow diagram illustrating an exemplary fabrication method 60. The method 60 begins with forming a gate structure on the substrate (step 62), for example using a process similar to that described above in reference to steps 32 through 40 of FIG. 2. At this point, the gate electrode includes only a poly material.

A metal layer, for example of nickel, is then formed (step 64) over the gate structure. Once the metal layer is in place, a first RTA is performed (step 66), rapidly heating the deposited metal for a short period of time. This drives some of the metal into combination with the poly in the gate electrode, forming a silicide material out of at least the top portion of it. The excess metal, that is the metal material that has not combined with the poly gate, is then removed (step 68). A second RTA is then performed (step 70), to drive the metal in the poly gate further into the poly material. In contrast to previous techniques, which involved the formation of a silicide layer at the top of the poly gate, for example to create a better contact region, the first and second RTA sequences described above are intended to produce what is referred to as a FUSI (fully-silicided) gate. Note that FIG. 3 illustrates only the silicidation process; from there, fabrication continues through the additional operations involved in completing the device.

Unfortunately, problems may arise when forming silicided gates in this manner, especially when they are part of dual-gate semiconductor devices such those in CMOS applications. This is due to the fact that the different transistors in a CMOS device require for optimum performance different types, or phases, of the nickel silicon (or other) alloy that will make up the FUSI gate. Specifically, in a PMOS gate having an $Ni_3Si$ gate, an excess of the alloy will frequently occur, that is, there will be a large volume change resulting from the silicidation process. This volume change may in fact be of such magnitude as to cause damage to the underlying gate dielectric layer, which may adversely affect device performance and overall reliability.

Needed, then, is an efficient way to fabricate gates, and specifically the gate electrodes used in semiconductor devices such as transistors that can take advantage of the benefits of salicidation while at the same time minimizing, or altogether avoiding the stress-induced damage caused by volume change during salicidation. The present invention provides just such a solution.

SUMMARY OF THE INVENTION

These and other problems are generally solved or circumvented, and technical advantages are generally achieved, by preferred embodiments of the present invention, which are directed to a method of fabricating a semiconductor device, for example a CMOS device.

In accordance with a preferred embodiment of the present invention, a method for fabricating a semiconductor device comprises forming a gate structure on a semiconductor substrate, forming and siliciding a source region and a drain region, optionally etching the poly gate electrode to reduce its thickness, raising the temperature of the fabrication environment to an elevated temperature of at least about 250° C., and preferably within a range from about 250° C. to about 700° C., depositing a metal layer while the environment is at this elevated temperature, and then removing any un-reacted metal. The metal is preferably nickel and is deposited using a sputtering technique. The method may also include performing an RTA (rapid thermal anneal) after the excess metal has been removed to further propagate the silicide formation, if necessary, or to increase the grain size of the silicide material in the gate electrode, if desired.

In accordance with another preferred embodiment of the present invention, a method of forming a dual-gate semiconductor device includes providing a substrate, forming a well in the substrate to define a region, depositing a dielectric layer over the substrate, depositing a poly layer over the dielectric layer, selectively forming photoresist or other protective structures over the poly layer, and etching to form two gate structures. A source region and a drain region may then be formed on respective sides of each gate structure and silicided. One of the poly gate electrodes is then reduced in thickness relative to the other, for example by etching. Both of the poly gates are then exposed, and the fabrication environment is raised to an elevated temperature of at least 250° C. A metal is then deposited while the environment is maintained at the elevated temperature, preferably using a sputtering technique. The temperature may then be reduced and the excess metal removed along with any protective structures that were put in place form the deposition process.

An advantage of a preferred embodiment of the present invention is that it reduces the risk of damage to the gate structure due to volume change during the silicidation process. In other words, embodiments of the present invention are targeted to reducing or eliminating stress-induced degradation through optimization of the FUSI salicidation process. Gate-dielectric integrity is expected thereby to be maintained, and good device reliability and performance to be achieved.

A further advantage of a preferred embodiment of the present invention is that it may require fewer process steps than conventional silicidation processes, or at least provide the option to eliminate some of those commonly used, thus reducing the cost of fabrication.

As more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a flow diagram illustrating an exemplary method for fabricating a semiconductor device.

FIG. 4 is flow diagram illustrating a method of fabricating a semiconductor device according to an embodiment of the present invention.

DETAILED DESCRIPTION OF ILLUSTRATIVE EMBODIMENTS

Figure 1:
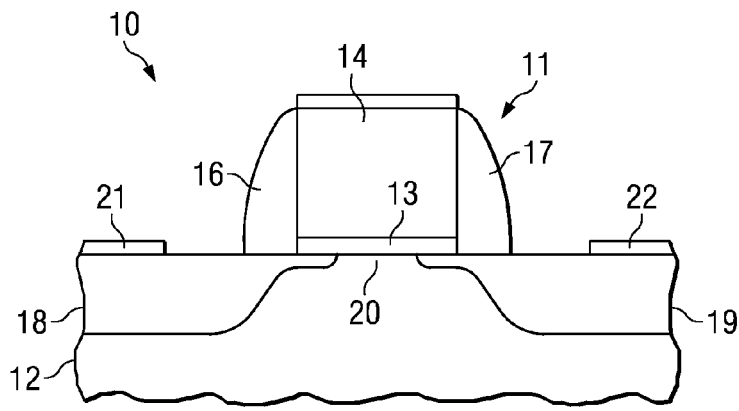
FIG. 1 is an elevation (side) view illustrating in cross-section an exemplary transistor.
Figure 2:
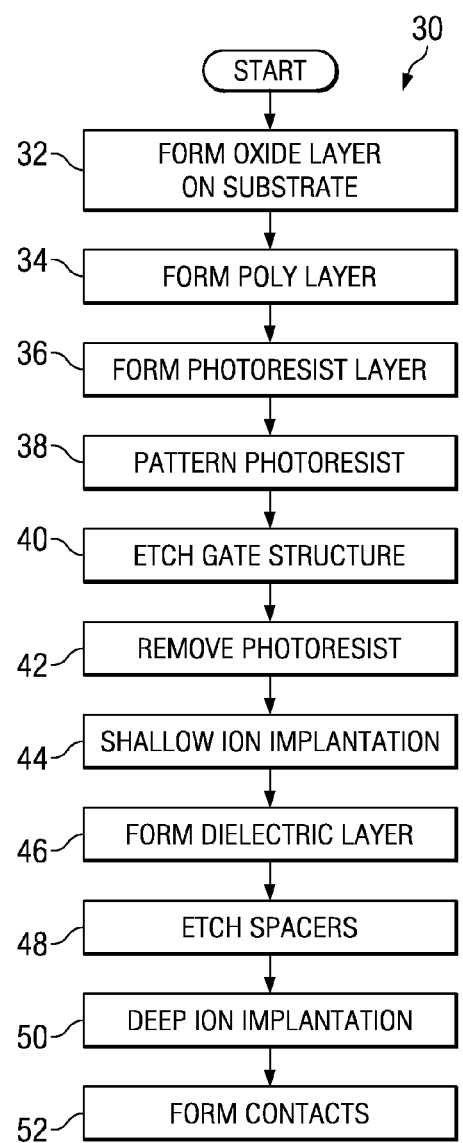
FIG. 2 is a flow diagram illustrating an exemplary method of fabricating a semiconductor device, in this case the transistor shown in FIG. 1.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method for fabricating certain types of semiconductor devices, in particular those used in CMOS applications. The invention may also be applied, however, to other types of semiconductor devices as well. More specifically, the present invention is directed to a method for fabricating a gated semiconductor device and is especially advantageous in applications involving relatively small components that include FUSI (fully-silicided) gates. As mentioned above, current fabrication practice involves the deposition of a metal layer and two RTAs (rapid thermal anneals) to ensure that the gates are in fact fully-silicided. One or both of these annealing steps may be eliminated by applying a method according to the present invention, an embodiment of which will now be described with reference to FIGS. 4, 5a through 5d, and 6a thorough 6i.

FIG. 4 is flow diagram illustrating a method 100 of fabricating a semiconductor device according to an embodiment of the present invention. At START, it is presumed that the necessary materials and equipment are both available and operational. The method 100 then begins with forming a gate structure (step 105) on a substrate of silicon or some other suitable material. In its most basic form, the gate structure includes a gate electrode of poly (crystalline polysilicon) physically separated from the substrate by a layer of dielectric material. Dielectric spacers disposed adjacent the sides of the poly gate electrode, and often extending above and below it, may be considered part of the gate structure for purposes of this disclosure In the embodiment of FIG. 4, the gate structure, or at least the gate electrode, is then protected by the formation and patterning of a photoresist cap (step 110) or some similar structure such as a hard mask. The source region and the drain region are then formed (step 115) by ion implantation into the substrate on respective sides of the gate structure. A metal layer is then deposited (step 120), and an annealing process performed (step 125) to silicide the exposed source and drain regions. The excess metal is then removed (step 130), as is the photoresist or other cap (step 135) protecting the gate electrode. In this embodiment, an ILD (inter-layer dielectric) layer is then formed (step 140), and selectively etched back (step 145) to expose the gate electrode. In some cases, it is advantageous to etch back the poly gate electrode (step 150) to reduce its thickness to obtain the correct silicide phase, although in others it is not and therefore this operation is optional.

Once the gate electrode is exposed and, if desired, reduced in thickness, the device is placed in a thermally-elevated environment (step 155), preferably being heated to a temperature of at least about 250° C. The presently-preferred range for the environment is from about 200° C. to 700° C., with temperatures in the middle to upper portions of this range yielding the best results in many applications. Note that there may be a number of ways to achieve a thermally-elevated environment, though none are specifically preferred for performance of the method of the present invention. Generally speaking, however, the technique used for maintaining the elevated temperature should be able to keep the temperature at the desired level throughout the following metal deposition process. This will typically, though not necessarily involve placing the wafer in a relatively-closed environment. If the temperature is for some reason already in the appropriate range, or at the desired specific level, then this step involves only maintaining that temperature for the operation that follows.

When the environment has been adjusted to the desired temperature, a metal layer is deposited (step 160). In a preferred embodiment, nickel or a nickel alloy is deposited using a sputtering technique, although other materials and, in some cases other methods, may be used as well. The metal layer may in some embodiments be a metal-containing layer, that is, one that contains one or more metals and may contain one or more non-metals. Note that as used herein, "metal-containing" will refer to material that contains at least one metal and may, but does not necessarily have to, include a non-metal. Note that use of the term "layer" does not imply that any particular structure or formation of the material resulting from the deposition. As the metal (or metal-containing) layer is deposited, the silicidation process takes place, and will be allowed to continue until all, or nearly all of the poly gate has been consumed. The environmental temperature may then be returned to a non-elevated condition (step 165). Of course, it is not necessary to lower the temperature of the fabrication environment if an elevated temperature remains desirable for some other reason. It is noted that during this process, the metal layer may be deposited on the source and drain regions as well. To avoid this, a photoresist structure or hard mask may be formed over these and any other areas to be protected. In either case, at this point the excess (that is, un-reacted) metal is then removed (step 170), for example using a CMP (chemical mechanical polish) process. Note that where, for example, the metal-containing layer includes a non metal, some of the non-metal may be removed during this step as well, if desired.

In the embodiment of FIG. 4, an RTA may then be performed (step 175), if such an operation is deemed necessary or desirable. In one sense, this operation is optional. The RTA may, however, be used to ensure that the poly material in the poly gate electrode is fully consumed. It may also serve the purpose of increasing the grain size of the poly gate electrode, even if no further silicidation is necessary. Optimizing grain size, of course, improves the performance of semiconductor devices such as PMOS FETs. Again, however, this RTA step is not a required part of the present invention unless specifically recited in a particular embodiment.

In an alternate embodiment (not shown), the source region and the drain region may instead be formed after gate silicidation. In this alternate embodiment, after silicidation, a protective structure is formed over the gate structure. This may be, for example, an appropriately-patterned photoresist or hard mask layer. Ion implantation, or doping, is then performed to create the source region and the drain region in the substrate adjacent to the gate structure. A metal layer is then formed, for example out of nickel or copper. This layer will be used to create the contacts for the source and drain region. The contacts themselves are then formed, for example by using a selective etching process. In some applications (also not shown), a separate contact may be formed over the gate electrode as well. Instead of simply creating contacts, of course, an RTA may be performed to create a silicide on at least the top portion of the source and drain regions. Note that source and drain silicidation is optional, and may not be performed in all applications. Note also that in another embodiment (not shown in FIG. 4), the silicide process for the source region and the drain region may be performed at the same time as the gate electrode silicidation. Finally, note that the sequence of operations illustrated in FIG. 4 may vary in any logical order in accord with the present invention, in some embodiments with the insertion of additional operations. In general, operations of the methods of the present invention may be performed in any logically-permissible order unless a specific order is recited in regard to a particular embodiment.

Figure 5A:
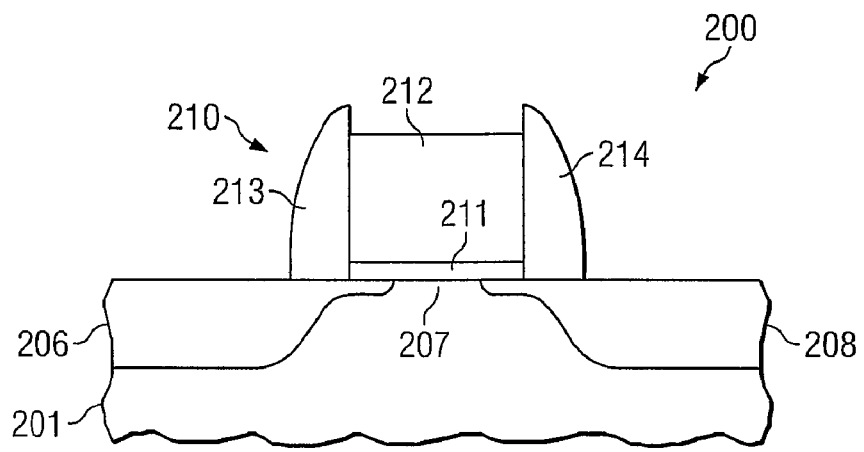
FIGS. 5a through 5i are a sequence of side views illustrating in cross-section the configuration of a semiconductor device at various stages of fabrication according to an embodiment of the present invention.

Another embodiment is shown in FIGS. 5a through 5i. FIGS. 5a through 5i are a sequence of side views illustrating in cross-section the configuration of a semiconductor device 200 at various stages of fabrication according to an embodiment of the present invention. As with the embodiment of FIG. 4 above, the sequence starts with the formation of a gate structure 210 on a substrate 201, as shown in FIG. 5a. In this embodiment, gate structure 210 includes an oxide layer 211, which physically separates the poly gate electrode 212 from the substrate 201. Source region 206 and drain region 208 have already been formed in the substrate 201, for example by in-situ doping. Source region 206 and drain region 208 define a channel 207 beneath the gate structure 210. Spacers 213 and 214 are formed at each side of gate structure 210.

Figure 5B:
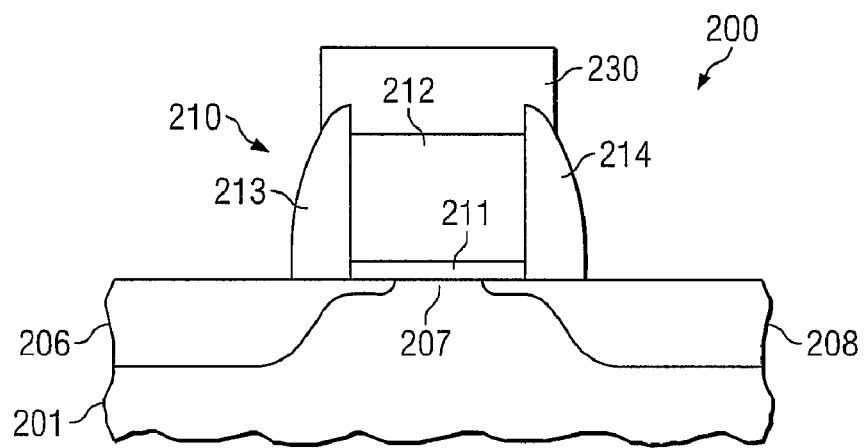
Figure 5C:
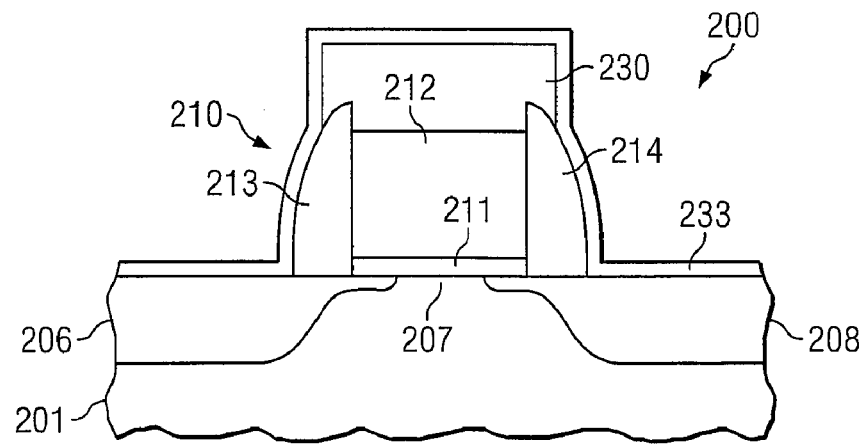
Figure 5D:
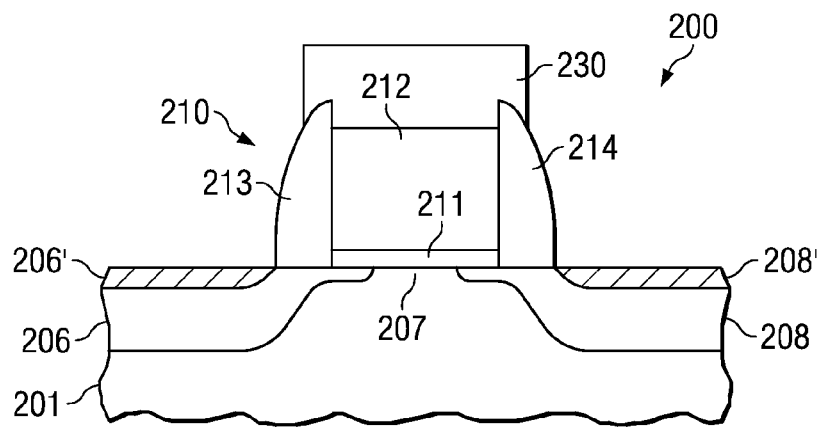

In the embodiment of FIGS. 5a through 5i, a cap 230 is then formed over the gate structure, as shown in FIG. 5b. The cap 230 may be photoresist or a hard mask, for example. It may protect the entire gate structure 210 and may actually cover a portion of the source region 206 and the drain region 208, but in any event must protect the gate electrode 212. A metal layer 233 is then formed, as shown in FIG. 5c. An RTA is used to cause some of the metal to react with the respective upper portions of the source and the drain regions. The excess, that is, un-reacted metal is then removed. As can be seen in FIG. 5d, a silicided portion 206' has been formed near the upper boundary of source region 206 and a silicided portion 208' has been formed near the upper boundary of drain region 208.

Figure 5E:
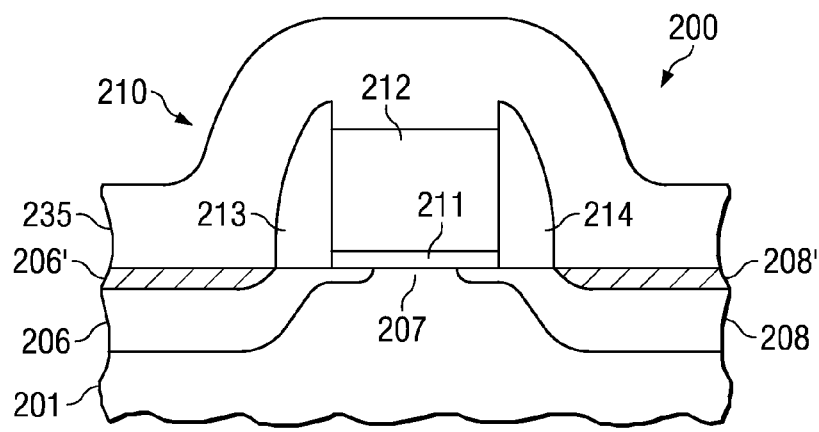
Figure 5F:
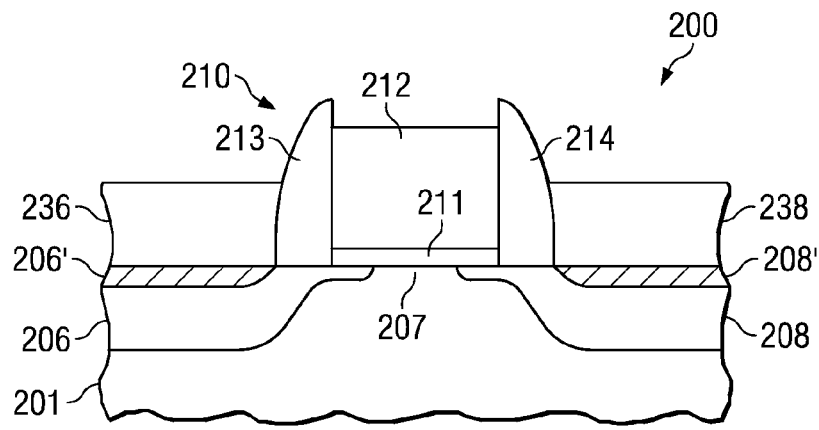
Figure 5G:
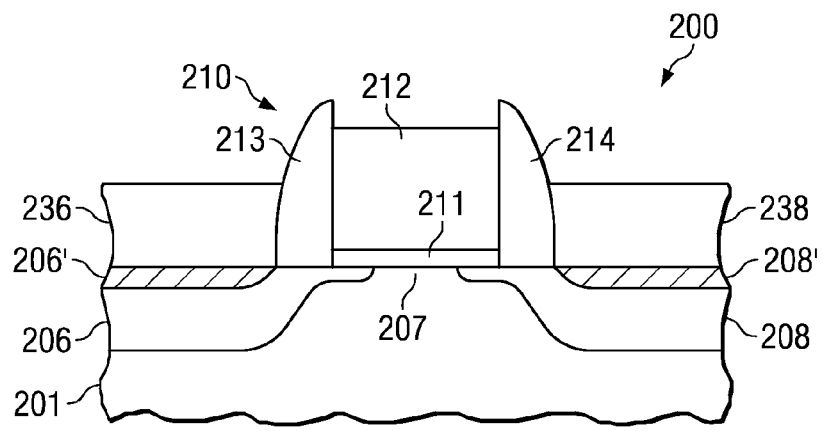

In this embodiment, the cap 230 is then removed and an ILD 235 layer is deposited, as shown in FIG. 5e. The ILD layer 235 will protect the now-silicided source and drain regions in subsequent operations, but access is needed to the gate electrode 212, so the ILD layer 235 is removed from that region, as shown in FIG. 5f, for example by a CMP process. This removal effectively separates the ILD layer into the separate structures 236 and 238, which are visible in FIG. 5f. As should be apparent, ILD structures 236 and 238 protect source region 206 and the drain region 208, respectively. In this embodiment, the gate electrode 212 is then etched back to reduce its thickness, as shown in FIG. 5g. This operation is optional, however, and is of course not performed where, for example, the gate electrode is already at the appropriate thickness.

The semiconductor device 200 is then placed in a thermally-elevated environment, or maintained in one if the ambient temperature is already at a satisfactory level. As mentioned above, the thermally-elevated environment should be maintained at a temperature within a range from about 200° C. to 700° C. Nickel is then applied by sputtering, which in this environment consumes at least a portion of the poly material in gate electrode 212 and converts it to $Ni_xSi_y$, where x and y determine the phase of the resulting silicide material.

The desirable phase may vary according to the application for which the gate is intended. For example, NiSi may be created for an NFET and $Ni_3Si$ for a PFET. Factors affecting the phase of the silicide gate material include the thickness of the poly layer, the environmental temperature, the amount of nickel deposited, and the rate at which it is applied.

Figure 5H:
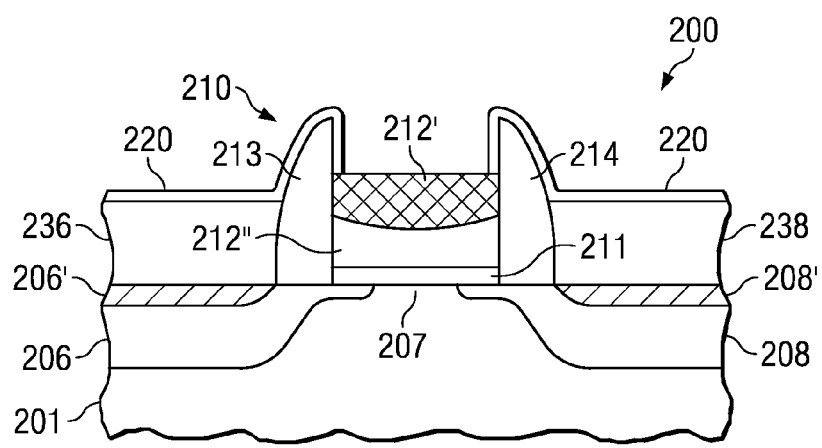
Figure 5I:
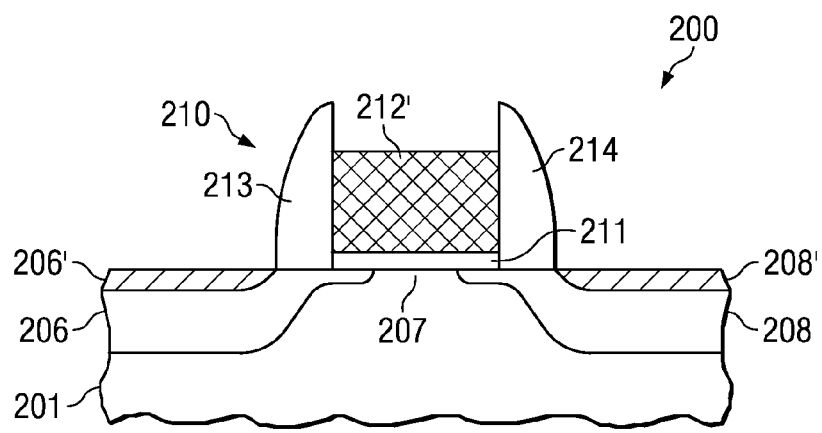

In the embodiment of FIGS. 5a through 5i, the deposition of the nickel layer 220 results in a silicide region 212' at the top of gate electrode 212, effectively disposed atop a remaining poly portion 212" (although the boundary between the silicide and the un-reacted poly may be gradual rather than sudden). This configuration is shown in FIG. 5h. To further consume the remainder of the poly gate, according to this embodiment of the present invention an RTA is performed to complete the silicidation process. In a preferred embodiment, any unreacted metal is removed prior to performing the RTA. A wet etch process may be used for this purpose. The RTA may also have the effect of further changing the phase of the silicided material, making it more uniform, or increasing the grain size of the material. The remaining photoresist structures may then be removed. As mentioned above, in other embodiments (not shown) the RTA need not be performed. After the RTA of the embodiment of FIGS. 5a through 5i, however, the poly in the gate electrode is fully consumed, resulting in the configuration shown in FIG. 5i.

Figure 6A:
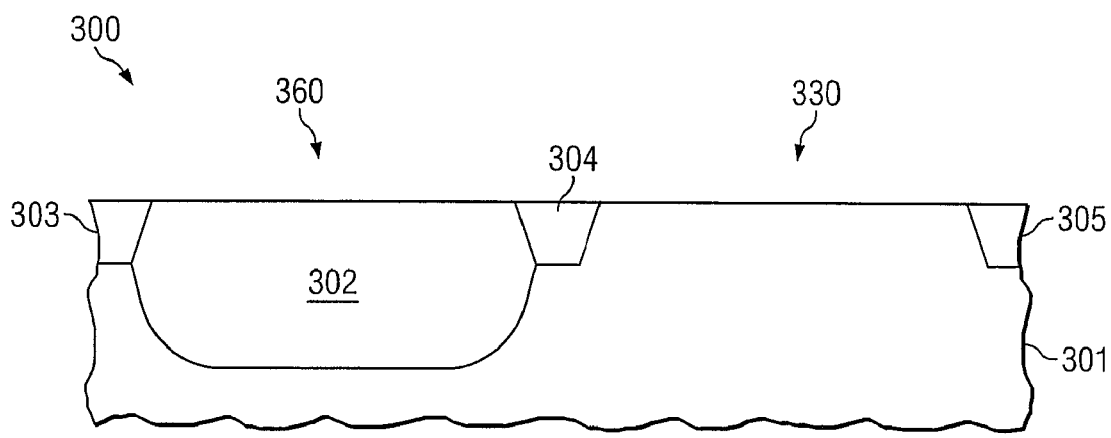
FIGS. 6a through 6i are a sequence of side views illustrating in cross-section the configuration of a semiconductor device at various stages of fabrication according to another embodiment of the present invention.

Another embodiment is shown in FIGS. 6a through 6i. FIGS. 6a through 6i are a sequence of side views illustrating in cross-section the configuration of a semiconductor device 300 at various stages of fabrication according to an embodiment of the present invention. Semiconductor device 300 is a CMOS device having an NMOS region 360 and a PMOS region 330, the former including a p-well 302 in the n-type substrate 301. The various regions are separated by oxide isolation structures. An isolation region 304, for example, separates the NMOS region 360 from the PMOS region 330. Isolation regions 303 and 305 separate these regions from others (not shown) formed in the substrate 301. In this regard, note that while for clarity only two regions are shown in FIGS. 6a through 6g, there are typically a great many being fabricated along with CMOS device 300. The configuration of the CMOS device 300 at this relatively-early stage of fabrication is illustrated in FIG. 6a.

Figure 6B:
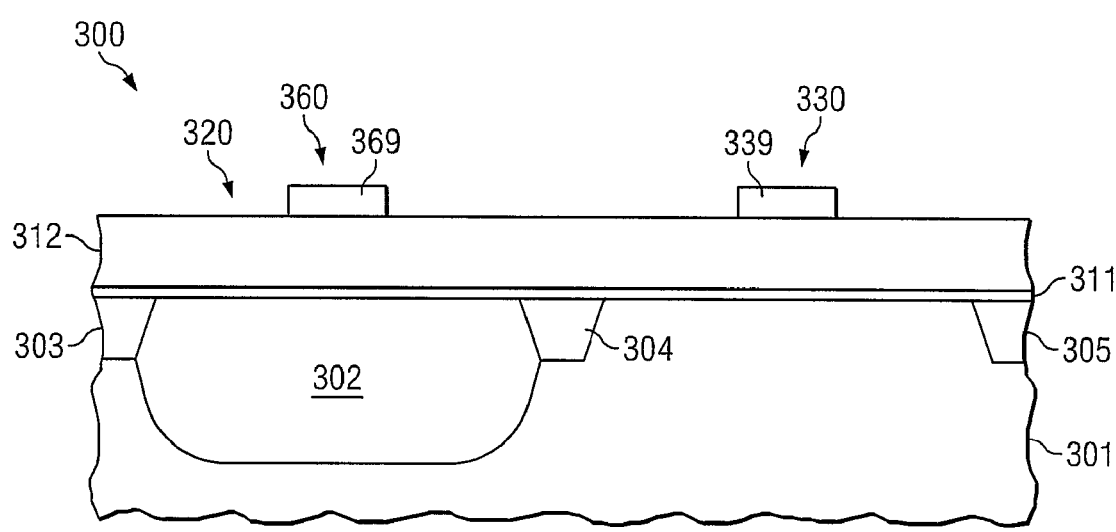

A thin layer of dielectric material 311, for example an oxide, is then deposited onto the substrate 301, and a poly layer 312 is formed over the dielectric layer 311. In this embodiment, a photoresist layer is then formed and patterned, leaving two photoresist structures 339 and 369 to protect certain portions of the gate stack 320. The gate stack is simply the collection of layered materials that will become the actual gate structures; photoresist structures 339 and 369, of course, protect the gates that are being formed. The CMOS device 300 at this stage is illustrated in FIG. 6b. Note that there may be additional layers used in other embodiments (not shown), for example the dielectric layer 311 may actually be constructed of two or three sub-layers. The use of additional materials on the gate stack 320, however, is not a requirement of the present invention unless explicitly recited in a specific claimed embodiment.

Figure 6C:
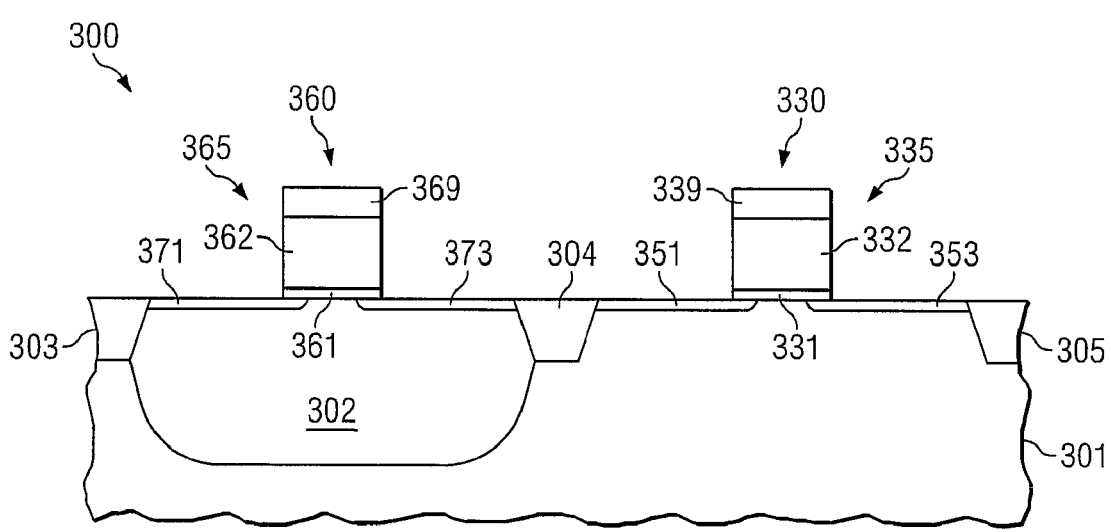

An etching process may now be used to define the gate structures; PMOS gate structure 335 and NMOS gate structure 365 may be seen in FIG. 6c. The components of each of these structures, formed from previously deposited layers, are now referred to separately; PMOS gate structure 335 includes gate dielectric 331 and gate electrode 332, and NMOS gate structure 365 includes gate dielectric 361 and gate electrode 362. Also visible in FIG. 6c are the shallow source and drain regions formed in the substrate 301 and associated with each portion of the CMOS device 300. Adjacent the PMOS gate structure 335 are PMOS shallow source region 351 and PMOS shallow drain region 353. Likewise, adjacent the NMOS gate structure 365 are NMOS shallow source region 371 and NMOS shallow drain region 373. As indicated by their name, the shallow source and drain regions are formed near the surface and include small extensions (shown but not separately numbered) that are disposed directly under the respective gate structure to which they are adjacent.

Figure 6D:
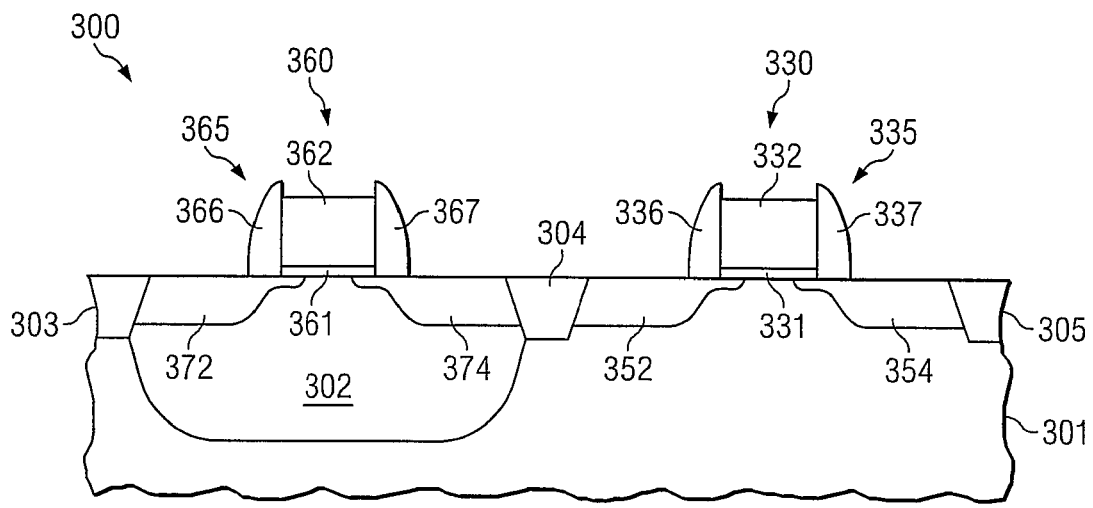

The dielectric spacers may then be formed, and the photoresist structures removed. The formation of the dielectric spacers is typically a multi-step process involving the deposition and selective etching back of a layer of dielectric material. The result, according to this embodiment, yields dielectric spacers 336 and 337 on PMOS gate structure 335, and dielectric spacers 366 and 367 on NMOS gate structure 365 as shown in FIG. 6d. After the dielectric spacers are in place, additional doping may be performed to form the deeper portions of the source and drain regions, also shown in FIG. 6d. Adjacent the PMOS gate structure 335 and now integral with the PMOS shallow source region 351 is PMOS deep source region 352. That is, the shallow and deep portions of these regions now form a single region (which may or may not be doped consistently throughout) shaped by the manner in which it was formed. Similarly, a PMOS deep drain region 354, NMOS deep source region 372 and NMOS deep drain region 374 are formed integral with their respective shallow regions. The remaining photoresist regions, including any that may have been added in connection with the deep source and drain doping, may now be removed.

Figure 6E:
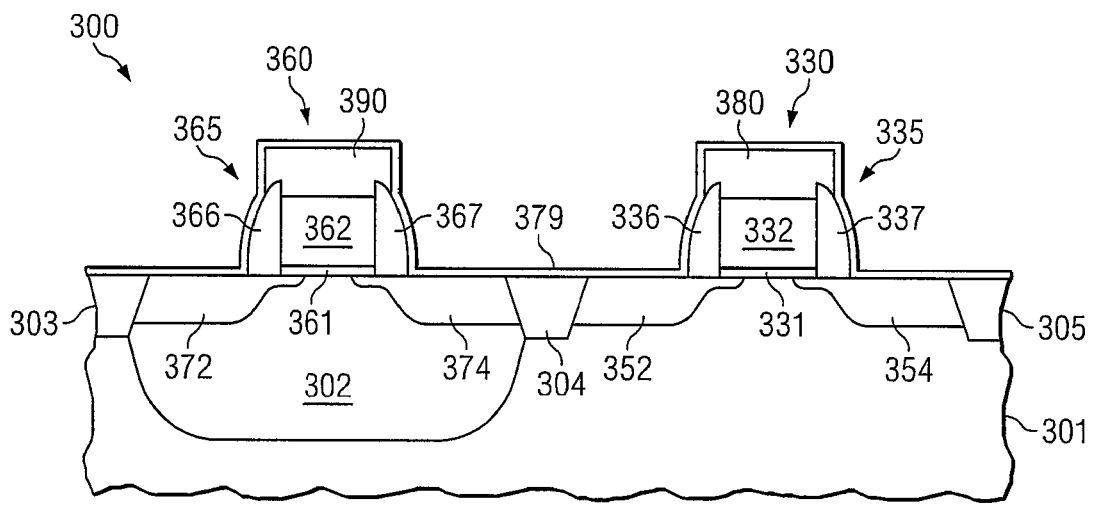
Figure 6F:
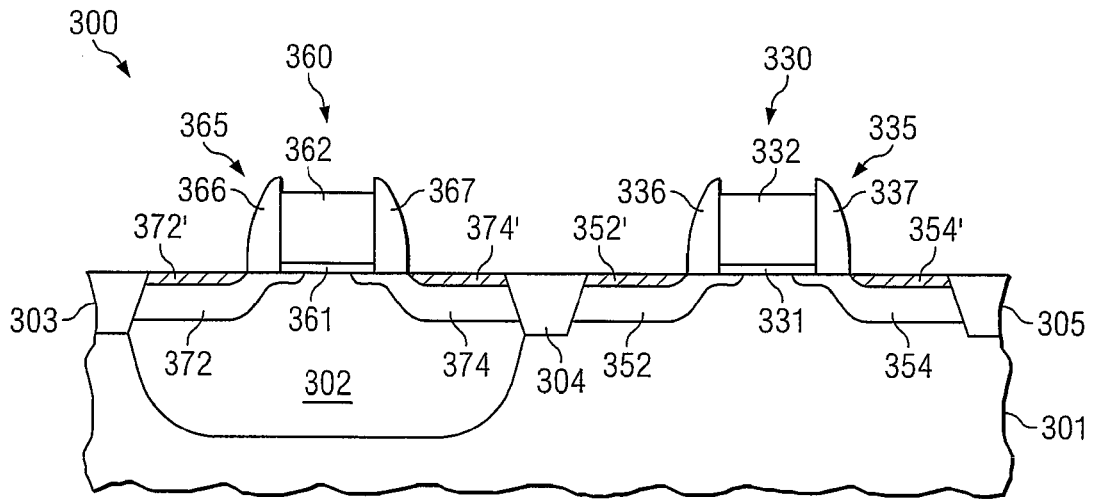

In the embodiment of FIGS. 6a through 6i, a cap 380 is then formed over the PMOS gate structure 335, and a cap 390 is formed over the NMOS gate structure 365. As with the embodiment of FIGS. 5a through 5i, described above, the caps may be hard masks or photoresist or some other protective structures, and the extent of their coverage may vary so long as the gate electrodes 332 and 362 are protected. A metal layer 379 is then formed, as shown in FIG. 6e. An RTA is used to cause some of the metal to react with the respective upper portions of the source and the drain regions. The excess, that is, un-reacted metal is then removed, as are the protective caps 380 and 390. As can be seen in FIG. 6f, silicided portions 352', 354', 372', and 374' have been formed near the upper boundaries of their respective source or drain regions.

Figure 6G:
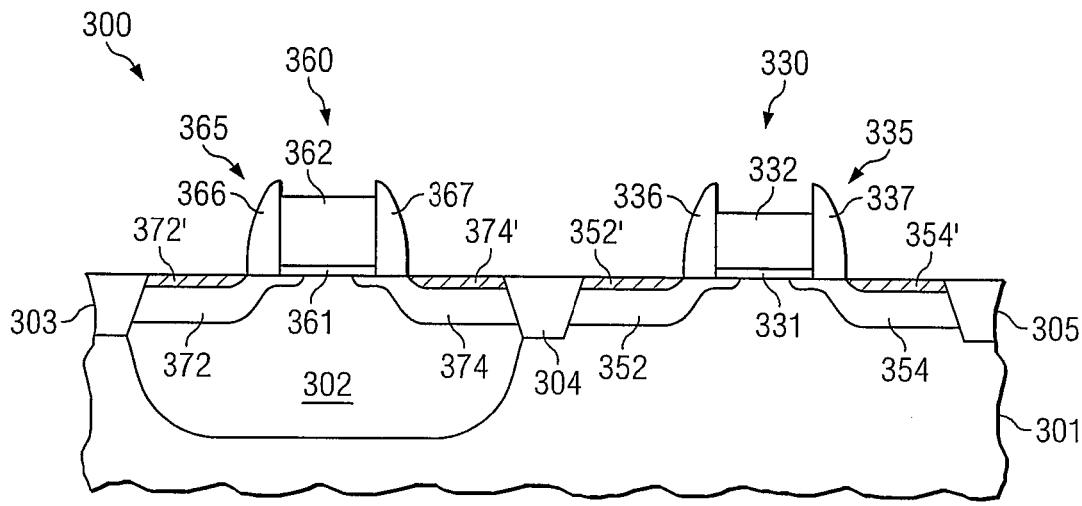
Figure 6H:
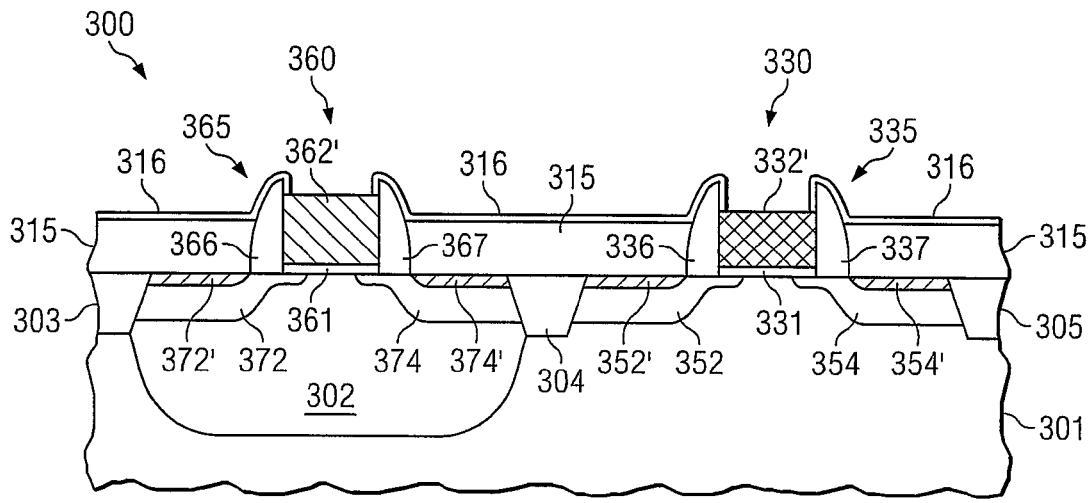

In this embodiment, a layer of photoresist is then added, and patterned to leave unprotected the PMOS gate electrode 332. A similarly configured hard mask could be used as well. When the protective layer has been put into place, an etching process is then performed to reduce the height of the poly PMOS gate electrode 332, that is, its thickness, relative to the NMOS gate electrode 362. As mentioned above, gate electrode silicide phase control is a function of thickness, among other factors, and reducing the relative thickness of the PMOS gate electrode relative to the NMOS gate electrode will facilitate the formation of different silicide phases for each of the respective gates. Once the etching process has reduced the PMOS gate electrode 332 to its desired height and been terminated, the protective layer over the NMOS gate electrode 362 is removed as well. This configuration is shown in FIG. 6g.

Figure 6I:
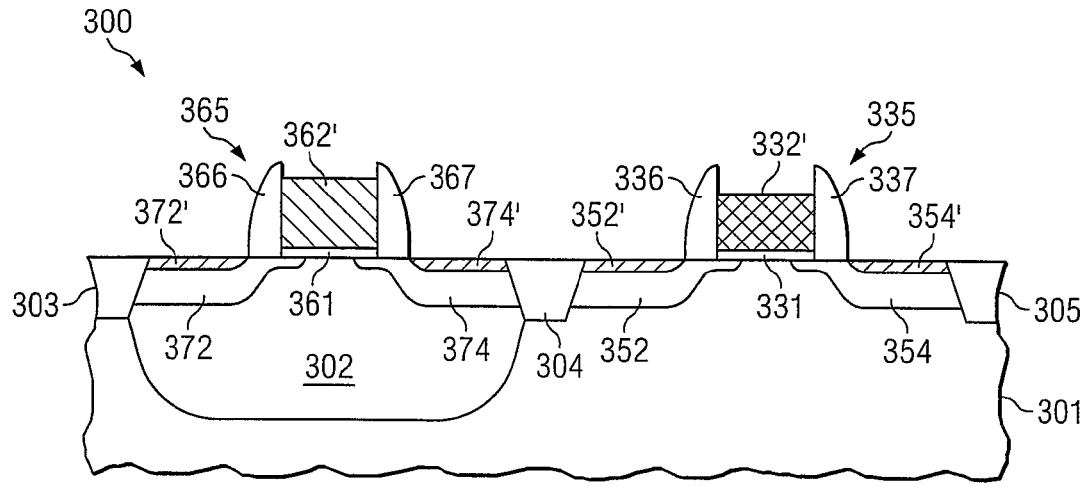

An ILD layer 315 is then formed and patterned, or etched or polished back to protect the source and drain regions, while leaving the gate electrodes 332 and 362 exposed. Also, in other embodiments (not shown), the previously-deposited protective layers may simply be left in place, or partially left in place, to protect these regions. The fabrication environment is then thermally-elevated or, if already at the desired temperature for metal deposition, maintained at that temperature. In this embodiment, a nickel layer is then deposited using a sputtering technique, resulting in the configuration illustrated in FIG. 6h. Here, it may be seen that the silicided PMOS gate electrode 332' has been fully silicided to $Ni_3Si$ and the silicided NMOS gate electrode 362' has been fully silicided to NiSi. The excess Ni layer 316 may then be removed, along with the remaining photoresist structures 315, as shown in FIG. 6i. The remaining fabrication of CMOS device 300 may then proceed.

Although the present invention and its advantages have been described in detail, it should be understood that various changes, substitutions and alterations can be made herein without departing from the spirit and scope of the invention as defined by the appended claims. For example, the sequences described in performing the present invention may be varied in any logically-permissible order consistent with a particular claimed embodiment. The materials used for may also be varied from those suggested above while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, comprising:
    forming a gate structure on a substrate, wherein the gate structure comprises a poly electrode;
    heating a fabrication environment to a temperature of at least about 200° C.;
    depositing a metal-containing layer on the gate structure while the temperature remains elevated such that the metal-containing layer reacts with substantially all of the poly electrode to form a silicide; and
    removing any un-reacted metal.

2. The method of claim 1, wherein heating the fabrication environment comprises heating the fabrication environment to a temperature of at least about 400° C.

3. The method of claim 1, wherein heating the fabrication environment comprises heating the fabrication environment to a temperature within a range from at least about 400° C. to no more than about 700° C.

4. The method of claim 1, wherein the metal-containing layer comprises nickel.

5. The method of claim 1, wherein the metal-containing layer comprises a nickel alloy.

6. The method of claim 5, wherein the nickel alloy comprises platinum.

7. The method of claim 4, further comprising the step of adjusting a thickness of the poly gate electrode so that at least a portion of the gate electrode comprises $Ni_3Si$ after depositing the metal-containing layer.

8. The method of claim 1, wherein forming the gate structure comprises forming two gate structures.

9. The method of claim 8, wherein the semiconductor device is a CMOS device.

10. The method of claim 9, wherein forming the two gate structures comprises forming a PFET gate structure having a poly gate electrode and an NFET gate structure having a poly gate electrode, and further comprising the step of etching the PFET poly gate electrode so that it is not as thick as the NFET poly gate electrode.

11. The method of claim 10, wherein thicknesses of the respective poly gate electrodes are formed to produce the NFET gate electrode comprising NiSi and the PFET gate electrode comprising $Ni_3Si$.

12. The method of claim 1, further comprising the step of performing an RTA (rapid thermal anneal) following deposition of the metal-containing layer and the removal of any un-reacted metal.

13. The method of claim 1, wherein the removal of any un-reacted metal is performed using a wet etch procedure such that the silicide remains.

14. A method for fabricating a semiconductor device, comprising:
    forming a first gate structure and a second gate structure on a semiconductor substrate, wherein the first gate structure and the second gate structure each comprise a poly electrode;
    forming a first cap protecting the first gate structure and a second cap protecting the second gate structure;
    forming a source region and a drain region adjacent to each of the first gate structure and the second gate structure;
    siliciding the source regions and the drain regions;
    forming a protective layer over the source regions and the drain regions;
    heating a fabrication environment to a temperature of at least about 250° C.;
    depositing a metal-containing layer while the temperature remains elevated such that the metal-containing layer reacts with substantially all of the poly electrode of the first gate structure and the poly electrode of the second gate structure; and
    removing any un-reacted metal.

15. The method of claim 14, wherein heating the fabrication environment comprises heating the fabrication environment to a temperature of at least about 400° C.

16. The method of claim 14, wherein heating the fabrication environment comprises heating the fabrication environment to a temperature within a range from at least about 400° C. to no more than about 700° C.

17. The method of claim 14, wherein the metal-containing layer comprises nickel.

18. The method of claim 14, wherein the poly electrode of the first gate structure and the poly electrode of the second gate structure are of substantially equal thickness, and further comprising reducing a thickness of the poly electrode of the second gate structure prior to depositing the metal-containing layer.

19. The method of claim 18, wherein the second gate structure is a part of a PFET device.

20. A method for fabricating a CMOS device having a PFET and an NFET, comprising forming on a semiconductor substrate two gate structures comprising poly gates, forming a source region and a drain region for each of the gates, siliciding each of the source regions and drain regions, etching the PFET poly gate to reduce its thickness, and depositing a metal-containing layer, wherein the metal and the poly gates are at a temperature of greater than about 400° C. such that the metal reacts with substantially all of each of the poly gates to form a silicide.

21. The method of claim 20, wherein the metal-containing layer comprises nickel.

22. The method of claim 21, wherein the metal-containing layer comprises a nickel alloy.

23. The method of claim 22, wherein the metal-containing layer comprises platinum.

* * * * *